(12) United States Patent
Arora et al.

(10) Patent No.: US 12,014,213 B2
(45) Date of Patent: Jun. 18, 2024

(54) ACTIVE HIBERNATE AND MANAGED MEMORY COOLING IN A NON-UNIFORM MEMORY ACCESS SYSTEM

(71) Applicant: Advanced Micro Devices, Inc., Santa Clara, CA (US)

(72) Inventors: Sonu Arora, New York, NY (US); Daniel L. Bouvier, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 706 days.

(21) Appl. No.: 16/564,388

(22) Filed: Sep. 9, 2019

(65) Prior Publication Data

US 2021/0073037 A1 Mar. 11, 2021

(51) Int. Cl.
*G06F 9/50* (2006.01)
*G06F 1/3234* (2019.01)
*G06F 9/4401* (2018.01)
*G06F 12/02* (2006.01)
*G06F 12/1009* (2016.01)
*G11C 11/406* (2006.01)
*G11C 11/4074* (2006.01)

(52) U.S. Cl.
CPC .......... *G06F 9/5016* (2013.01); *G06F 1/3275* (2013.01); *G06F 9/4418* (2013.01); *G06F 9/442* (2013.01); *G06F 12/0238* (2013.01); *G06F 12/1009* (2013.01); *G11C 11/406* (2013.01); *G11C 11/4074* (2013.01); *G06F 2212/657* (2013.01)

(58) Field of Classification Search
CPC ...... G06F 9/5016; G06F 9/4418; G06F 9/442; G06F 1/3275; G06F 12/0238; G06F 12/1009; G06F 2212/657; G11C 11/406; G11C 11/4074
See application file for complete search history.

(56) References Cited

U.S. PATENT DOCUMENTS

| 2006/0015712 A1* | 1/2006 | Ang ..................... G06F 9/505 713/100 |
| 2006/0041711 A1* | 2/2006 | Miura ................... G11C 11/005 711/104 |
| 2008/0104344 A1* | 5/2008 | Shimozono ......... G06F 11/1441 711/162 |
| 2008/0228959 A1* | 9/2008 | Wang ..................... G06F 1/206 710/22 |
| 2010/0073573 A1* | 3/2010 | Yamaguchi ........ H04N 21/4436 348/E9.037 |

(Continued)

*Primary Examiner* — Nanci N Wong
(74) *Attorney, Agent, or Firm* — FIG. 1 Patents

(57) ABSTRACT

A method of operating a computing system includes storing a memory map identifying a first physical memory address as associated with a high performance memory and identifying a second physical memory address as associated with a low power consumption memory, servicing a first memory access request received from an application by accessing application data at the first physical memory address, in response to a change in one or more operating conditions of the computing system, moving the application data between the first physical memory address and the second physical memory address based on the memory map, and servicing a second memory access request received from the application by accessing the application data at the second physical memory address.

19 Claims, 6 Drawing Sheets

(56) References Cited

U.S. PATENT DOCUMENTS

| | | | | |
|---|---|---|---|---|
| 2010/0306493 | A1* | 12/2010 | Carrillo | G06F 16/2282 |
| | | | | 711/E12.001 |
| 2013/0205065 | A1* | 8/2013 | Kloeppner | G11C 5/144 |
| | | | | 711/E12.008 |
| 2014/0089631 | A1* | 3/2014 | King | G06F 12/1081 |
| | | | | 711/207 |
| 2014/0192583 | A1* | 7/2014 | Rajan | G11C 7/10 |
| | | | | 365/63 |
| 2016/0344834 | A1* | 11/2016 | Das | H04L 67/1097 |
| 2017/0206033 | A1* | 7/2017 | Ma | G06F 12/0246 |
| 2017/0293513 | A1* | 10/2017 | Shinbashi | G06F 3/0619 |
| 2017/0351450 | A1* | 12/2017 | Brandl | G06F 3/0604 |
| 2018/0103089 | A1* | 4/2018 | Chen | H04L 67/1025 |
| 2019/0018713 | A1* | 1/2019 | Foxworth | G06F 9/5094 |
| 2021/0034514 | A1* | 2/2021 | Cho | G06F 12/0871 |
| 2021/0035514 | A1* | 2/2021 | Cho | G09G 3/2007 |
| 2021/0055869 | A1* | 2/2021 | Shah | G06F 3/0643 |

* cited by examiner

ACTIVE HIBERNATE AND MANAGED MEMORY COOLING IN A NON-UNIFORM MEMORY ACCESS SYSTEM

BACKGROUND

A non-uniform memory access (NUMA) computing system includes a network of multiple nodes connected to each other by a high-performance interconnect fabric, which can have multiple system buses. Each node in the NUMA system can have zero or more processing units, memory, and/or input/output (I/O) buses. A memory controller in the NUMA system allows each node to use remote memory located on any of the other nodes in addition to its own local memory, effectively creating a single system image.

When a processor in one of the NUMA nodes accesses remote memory in a different node, the data is transferred from the remote memory over the interconnect fabric; thus memory latency is increased due to the slower data transfer rate when remote memory is used instead of local memory. Memory access times can also depend on the distance of the remote memory from the node accessing the memory. High latency due to the use of remote memory in a NUMA system can result in under-utilized processors, particularly when applications demand high memory bandwidth.

BRIEF DESCRIPTION OF THE DRAWINGS

The present disclosure is illustrated by way of example, and not by way of limitation, in the figures of the accompanying drawings.

DETAILED DESCRIPTION

Figure 1:
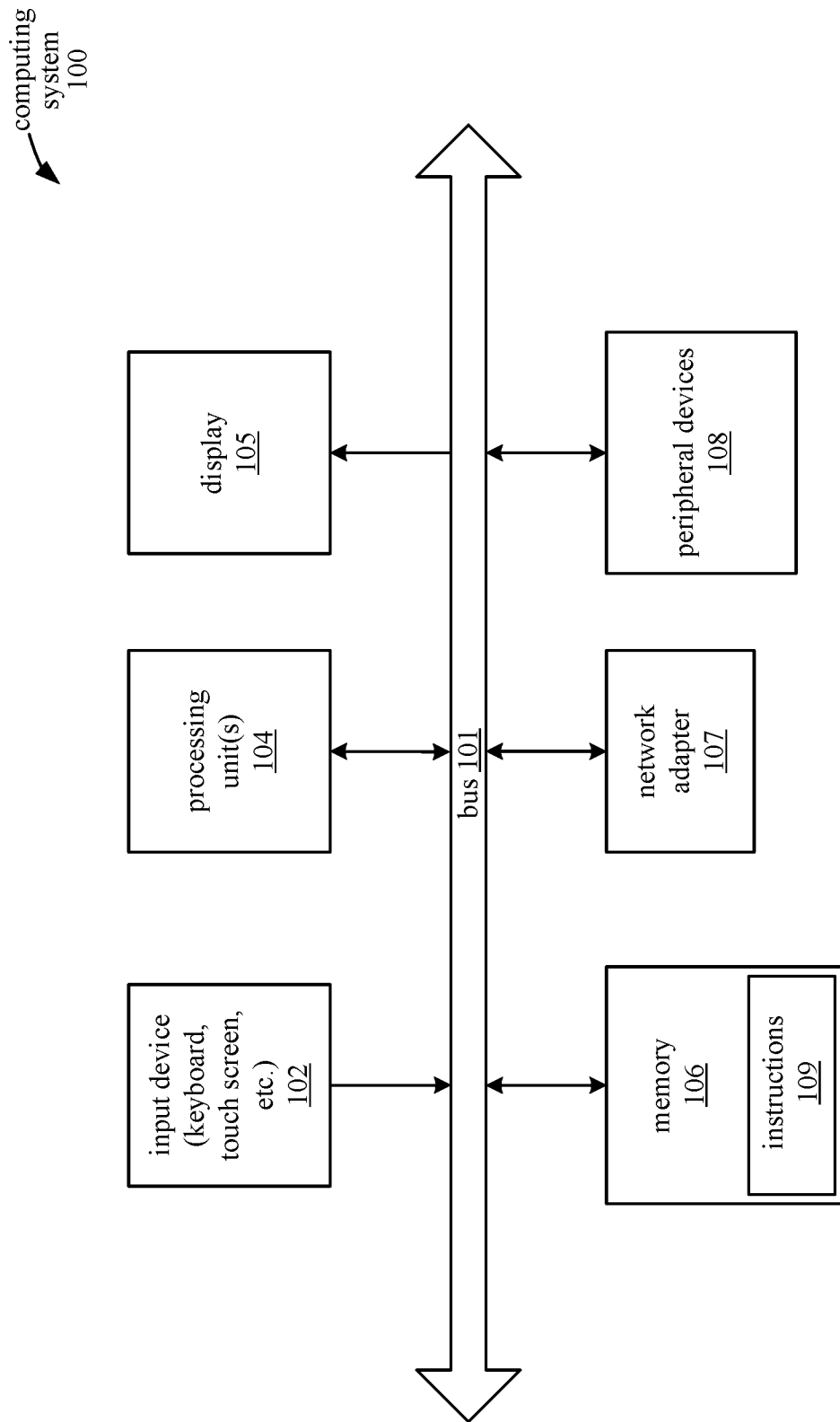
FIG. 1 illustrates a computing system, according to an embodiment.

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

In one embodiment, memory bottlenecks in a NUMA system are mitigated by including high performance memory in the system, such as High Bandwidth Memory (HBM), which is optimized for high parallel throughput. HBM is a stacked memory characterized by a memory bus that is very wide in comparison to other dynamic random access memories (DRAMs) such as Double Data Rate 4 (DDR4) or Low-Power Double Data Rate 4x (LPDDR4x). An HBM stack of four DRAM dies (4-Hi) has two 128-bit channels per die for a total of 8 channels and a total width of 1024 bits. HBM optimizes memory bandwidth per unit of power (i.e., picojoules/bit) and is therefore relevant for high performance applications such as gaming, machine learning, etc.

However, the amount of high performance memory (such as HBM) in a NUMA system is limited by its higher cost and by physical limitations such as package Z height limits and thermal constraints. Thus, any available high performance memory capacity should be utilized as efficiently as possible. In addition, tighter thermal constraints can result from the stacked die configuration and higher power consumption of high performance memory; HBM in particular has higher power consumption when operating in self-refresh mode than DDR4 or LPDDR4x, due to higher leakage through its wider circuits and due to a greater number of memory controller units and buses.

In one embodiment, a NUMA system includes both high performance stacked memory, such as HBM, in addition to low power consumption memory, such as DDR4 or LPDDR4x. Both of the high performance memory and the low power consumption memory have similar access latency; however, the high performance memory is optimized for high throughput at the expense of idle power consumption, while the low power consumption memory has lower throughput while consuming less power when idle. The low power consumption memory also provides a higher memory capacity due to its lower cost.

In the NUMA system, high touch frequency memory pages (i.e., pages that are accessed frequently) are migrated to the high performance memory for faster access. The high touch pages are dynamically moved between the high performance memory and the low power consumption memory in response to operating conditions in the NUMA system, such as memory access frequency, thermal metrics, application demands, power connection status, etc.

In one embodiment, the mechanism for migrating data from the high performance memory to the low power consumption memory is used to effect an active hibernate state, in which data in the high performance memory is moved to the low power consumption memory, and the high performance memory operates in self-refresh mode or is powered down completely to decrease system power consumption when providing high memory throughput is less critical. In active hibernation, the system continues working, accessing the data in the low power consumption memory instead of the high performance memory. The operating system updates page table entries for the migrated pages so that the transition to active hibernation is transparent to applications for which data is moved. Unlike a swap file on a disk that is not byte addressable by the CPU, the low power consumption memory such as DDR or LPDDR is byte-addressable by the CPU and is therefore readily usable by the CPU for executing application software while the system is in the active hibernation state.

In one embodiment, the active hibernate state and/or a self-refresh state are deployed in a managed memory cooling scheme where the system actively shifts data to low power consumption memory (e.g., onboard DDR or LPDDR memory) depending on the value of a thermal metric (e.g., the temperature of the HBM die stack exceeding a defined temperature threshold, or exceeding a temperature threshold for a minimum period of time). For example, if a threshold die temperature is exceeded in the high performance memory, an exemplary NUMA system migrates data from HBM to the lower powered onboard DDR or LPDDR memory before placing the HBM in self-refresh mode or powering down the HBM. The reduced memory access activity allows the HBM to cool, while the system continues working from the low power consumption memory.

In one embodiment, the data write latency for the low power consumption memory, such as DDR4 memory, is less than 100 nanoseconds; thus, even a large amount of data can be transferred from high performance memory to the low power consumption memory in a matter of nanoseconds or milliseconds. High performance memory such as HBM has access latencies similar to DDR or LPDDR, so restoring the data to the high performance memory is comparably quick. The fast data migration time allows the system to switch seamlessly between normal working (when high performance memory is in use) and active hibernate states without interrupting application execution.

FIG. 1 illustrates an embodiment of a computing system 100 in which memory cooling and active hibernate states are implemented. In general, the computing system 100 is embodied as any of a number of different types of devices, including but not limited to a laptop or desktop computer, mobile device, server, etc. The computing system 100 includes a number of components 102-108 that communicate with each other through a bus 101. In computing system 100, each of the components 102-108 is capable of communicating with any of the other components 102-108 either directly through the bus 101, or via one or more of the other components 102-108. The components 101-108 in computing system 100 are contained within a single physical enclosure, such as a laptop or desktop chassis, or a mobile phone casing. In alternative embodiments, some of the components of computing system 100 are embodied as peripheral devices such that the entire computing system 100 does not reside within a single physical enclosure.

The computing system 100 also includes user interface devices for receiving information from or providing information to a user. Specifically, the computing system 100 includes an input device 102, such as a keyboard, mouse, touch-screen, or other device for receiving information from the user. The computing system 100 displays information to the user via a display 105, such as a monitor, light-emitting diode (LED) display, liquid crystal display, or other output device.

Computing system 100 additionally includes a network adapter 107 for transmitting and receiving data over a wired or wireless network. Computing system 100 also includes one or more peripheral devices 108. The peripheral devices 108 may include mass storage devices, location detection devices, sensors, input devices, or other types of devices used by the computing system 100.

Computing system 100 includes one or more processing units 104, which in the case of multiple processing units 104 are capable of operating in parallel. The processing units 104 receive and execute instructions 109 that are stored in the memory subsystem 106. In one embodiment, each of the processing units 104 includes multiple computing nodes that reside on a common integrated circuit substrate. Memory subsystem 106 includes memory devices used by the computing system 100, such as random-access memory (RAM) modules, read-only memory (ROM) modules, hard disks, and other non-transitory computer-readable media.

Some embodiments of computing system 100 may include fewer or more components than the embodiment as illustrated in FIG. 1. For example, certain embodiments are implemented without any display 105 or input devices 102. Other embodiments have more than one of a particular component; for example, an embodiment of computing system 100 could have multiple buses 101, network adapters 107, memory devices 106, etc.

Figure 2:
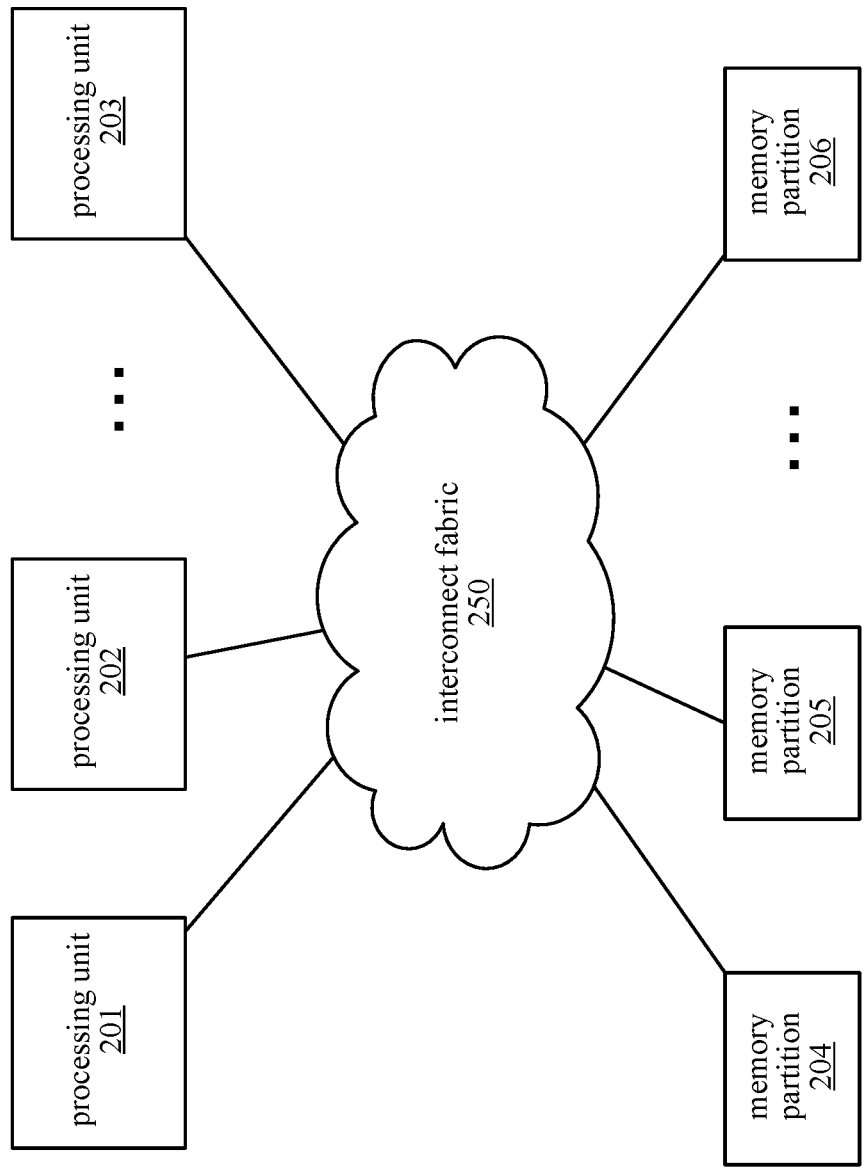
FIG. 2 illustrates multiple computing nodes connected via an interconnect fabric, according to an embodiment.

In one embodiment, the computing system 100 is a NUMA system in which the processing units 104 are implemented as multiple processing units and memory partitions connected by an interconnect fabric 250, as illustrated in FIG. 2. The interconnect fabric 250 connects multiple NUMA computing nodes together, which include processing units 201-203 and memory partitions 204-206. In one embodiment, these computing nodes 201-206 reside within the same device package and on the same integrated circuit die. For example, all of the nodes 201-206 can be implemented on a monolithic central processing unit (CPU) die having multiple processing cores. In an alternative embodiment, some of the nodes 201-206 reside on different integrated circuit dies. For example, the nodes 201-206 can reside on multiple chiplets attached to a common interposer, where each chiplet has multiple (e.g., 4) processing cores.

The interconnect fabric 250 includes a switch network and multiple interconnect links that provide, for each of the nodes 201-206, a transmission path to communicate with any other one of the nodes 201-206. In one embodiment, the interconnect fabric 250 provides multiple different transmission paths between any pair of origin and destination nodes, and a different transmission path for any given origin node to communicate with each possible destination node.

Figure 3:
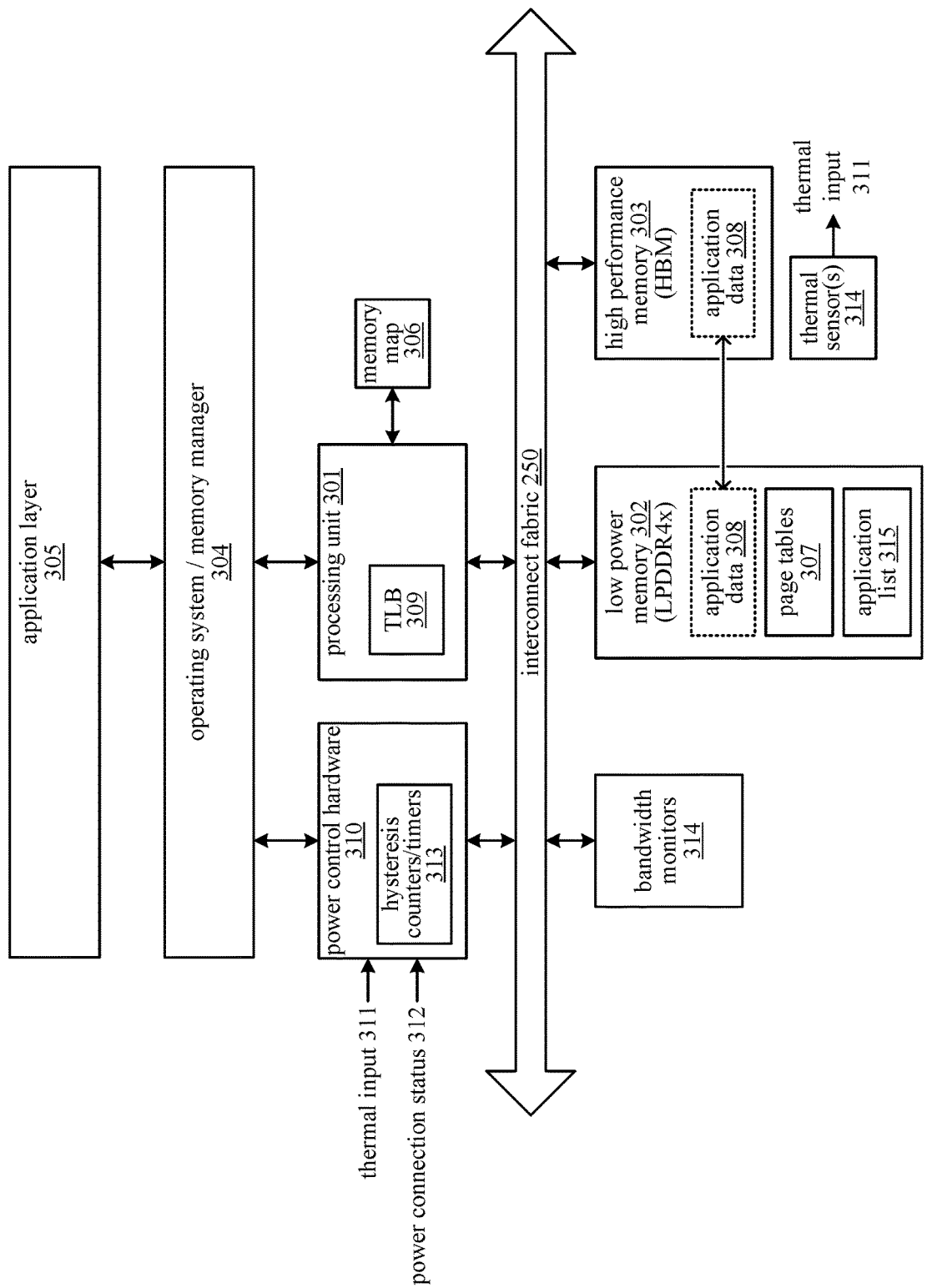
FIG. 3 illustrates components in a computing system, according to an embodiment.

FIG. 3 illustrates hardware components in one or more of the processing units 201-203 and memory partitions 204-206 that are connected via the interconnect fabric 250, according to an embodiment. The processing unit 301 performs computations by executing instructions on data stored in the memory partitions 204-207, which include low power consumption memory 302 and high performance memory 303 each residing in one or more of the memory partitions 204-207. In one embodiment, the processing unit 301 executes an operating system 304 (including a memory manager), which allocates memory for an application 305 executed by the processing unit 301 based on a distance of the allocated memory from the processor 301. While mechanisms are described herein with reference to an application 305 using application data 308, similar mechanisms in alternative embodiments are used with other types of applications and data (e.g., memory intensive system processes). Memory that is closer to the processing unit 301 (e.g., by physical or topological distance) is allocated with a higher priority than memory of the same type that is farther from the processing unit 301.

In addition to allocating memory for the application 305 based on distance, the processing unit 301 makes allocations also based on the performance or power consumption characteristics of the memory 302 and 303. Each of the high performance memory 303 and the low power consumption memory 302 is a byte-addressable memory having a memory access latency that is less than 100 nanoseconds; however, the high performance memory 303 has a higher data throughput than the low power consumption memory 302 and the low power consumption memory 302 has lower power consumption when operating in self-refresh mode than the high performance memory 303 operating in self-refresh mode.

The processing unit 301 has access to a memory map 306, which as a database that associates physical memory address ranges with the different types of memory available in the system. For instance, the memory map 306 identifies a first physical memory address range as being associated with the low power memory 302 and a second physical memory address range as associated with the high performance memory 303. The operating system 304 executed by the processing unit 301 uses the memory map 306 to identify destination physical memory addresses in the high performance memory 303 when migrating high touch data out of the low power memory 302. The memory map 306 is also used to determine which physical memory address to use for the initial allocation of application data 308, depending on whether the application data 308 being allocated is identified (e.g., via malloc( ) as high-touch data, or is associated with a memory intensive application (i.e., an application that demands a high memory throughput). In one embodiment, the memory map 306 also stores information about the physical locations (e.g., topological distance), access latency, and other characteristics of memory devices in the system that are also used when determining where to allocate or migrate data.

The processing unit 301 executes the operating system 304 and the application 305. The operating system 304 includes a memory manager that handles the initial allocation of memory for storing application data 308 for the application 305, and also handles the migration of the application data 308 between physical memory locations. The memory manager also manages the page tables 307 used for translating virtual memory addresses to physical memory addresses, which are updated when a migration occurs.

Data migration can be between different memory types (e.g., from memory 303 to memory 302, as illustrated) or between different memory devices of the same type (e.g., between DDR devices located at different distances from the processor). Data migration between memory devices of the same type can be performed when the data is requested by the processor; migration of the data to a node nearer to the processor can be triggered if there is sufficient spare memory capacity at the nearer node. Data migration between different types of memory is performed in response to a change in one or more operating conditions in the computing system, such as thermal measurements, bandwidth metrics (e.g., memory access frequency), input from the operating system (e.g., whether the application 305 demands high memory throughput), etc. In some cases, data migration between different types of memory can move the data to a memory node that is more distant from the processor that accesses the memory.

When a change is detected in one or more of the operating conditions, the operating system's memory manager 304 performs the migration by moving pages of application data 308 between a first physical memory address and a second physical memory address, where the first and second physical memory addresses are associated with different types of memory (e.g., high performance vs. low power memory) as indicated in the memory map 306. In one embodiment, the application data 308 is moved by copying the application data 308 from the first physical memory address to the second physical memory address, then invalidating, overwriting, or otherwise removing the original data from the first physical memory address. After the migration, one copy of the data remains at the second physical memory address, and the first physical memory address is available for reallocation, to be overwritten by other data.

The migration thus causes the data to be moved to a different physical memory address; however, the virtual memory address for the data remains unchanged so the migration is transparent to the application 305, which continues to use the same virtual memory address to access the data. In other words, the application 305 accesses the data prior to the migration via a first memory request for a virtual address, and after the migration via a second memory request for the same virtual address, even though the physical memory address has changed.

Virtual memory addresses are associated with physical memory addresses in the page tables 307 stored in the low power memory 302. When the application data 308 is migrated, the memory manager 304 also updates the page tables 307 to reflect the changed the physical memory address. Prior to migration, the virtual memory address of the application data 308 is associated with the first physical memory address in the page tables 307. When the data is migrated, the page tables 307 are updated to associate the virtual memory address with the second physical memory address. If the translation lookaside buffer (TLB) 309 in the processing unit 301 has cached page table entries that are changed due to the migration, these cachelines in the TLB 309 are invalidated. In one embodiment, since the cached entries are for high-touch data, the updated page table entries are prefetched back into the TLB 309.

The power control hardware 310 communicates with the operating system 304 and includes circuitry for powering on or powering off the high performance memory 303. In one embodiment, the operating system 304 signals the power control hardware 310 to power on the high performance memory 303 before migrating data 308 to the high performance memory 303, or to power off the high performance memory 303 after migrating data 308 out of the high performance memory 303.

The power control hardware 310 also receives signals indicating various operating conditions that can affect whether and when data is migrated between the high performance memory 303 and the low power memory 302. A thermal input 311 at the power control hardware 310 receives a thermal metric from one or more thermal sensors 314. In one embodiment, the thermal sensors 314 are used to measure thermal metrics (e.g., temperature, time above a threshold temperature, rate of temperature increase, etc.) within the computing system. In one embodiment, a thermal sensor 314 measures the temperature of the high performance memory 303 die to determine whether to enter the memory cooling state (or active hibernate state) to allow memory 303 to cool. When the sensor 314 detects a thermal condition (e.g., that the temperature of the high performance memory 303 exceeds a threshold), the power control hardware 310 receives the signal from the sensor 314 and indicates to the operating system 304 that the condition has been detected. The operating system 304 determines based on this input whether data 308 will be migrated out of the high performance memory 303.

If so, the operating system 304 transitions to the memory cooling state by migrating the application data 308 from the high performance memory 303 to the low power memory 302, then causes the high performance memory 303 to operate in self-refresh mode. Alternatively, the operating system 304 powers off the memory 303 to enter the active hibernate state. The application 305 continues working using the data 308 in the low power memory 302. In one embodiment, the low power memory 302 is byte-addressable; thus, portions (i.e., one or more bytes) of the application data 308 stored in the low power memory 302 are able to be accessed separately and independently by the application 305. Since memory accesses are no longer being performed in the high performance memory 303, the memory 303 is allowed to cool.

The power control hardware 310 also includes hysteresis counters and timers 313 to prevent rapid switching between the active hibernate and normal working states. Thus, the high performance memory 303 continues to operate in self-refresh mode or remains powered off until the hysteresis time-out period has elapsed and the memory 303 has cooled sufficiently (e.g., the previously measured thermal metric falls below the thermal threshold).

In one embodiment, the computing system 100 has a power input through which the system 100 can be selectively supplied power from either of multiple alternative power sources, such a battery or a high availability power supply such as a wall outlet or power mains. Information about the power available to the system 100 is transmitted to the power control hardware 310 via the power connection status 312. Thus, the operating conditions that can cause migration of data 308 between the two types of memory 302 and 303 can include power connection status information such as whether the system 100 is consuming battery power or is connected to a wall outlet, the amount of battery power remaining, etc. For instance, when the system 100 is disconnected from a high availability power supply such as a wall outlet and begins operating on battery power, the power control hardware 310 notifies the operating system 304. The operating system 304 determines based on this input whether data 308 will be migrated out of the high performance memory 303 to conserve battery power.

If so, the operating system 304 migrates the application data 308 from the high performance memory 303 to the low power memory 302. The high performance memory 303 operates in self-refresh mode until a hysteresis time-out period has elapsed and the power input is reconnected to the high-availability power supply.

A set of memory bandwidth monitors 314 is connected via the interconnect fabric 250 to the memory 302 and memory 303. The bandwidth monitors 314 measure the memory access frequency for the application data 308 while it is stored in the low power memory 302. When the access frequency for the application data 308 exceeds a frequency threshold, the operating system 304 migrates the data 308 from the low power memory 302 to the high performance memory 303. The bandwidth monitors 314 also monitor the access frequency for the data 308 when it is stored in the high performance memory 303, so that when the access frequency decreases below the same frequency threshold or a different threshold, the data 308 is migrated back to the low power memory 302.

In one embodiment, one type of operating condition is an indication from the application 305 itself that the application data 308 is high touch data. When requesting the allocation (e.g., via malloc( )), the application 305 indicates to the operating system 304 that the data 308 being allocated is high touch data. In response to receiving the allocation request with the high touch indication, the operating system 304 can decide whether or not to fill the allocation with high performance memory as requested, or allocate low power memory for the data 308. The decision is based on factors such as whether the application 305 is running in the background or foreground, a priority level of the application 305, whether the system is using battery power, etc. Based on the decision, the operating system identifies a physical memory address associated with either the high performance memory 303 or the low power memory 302 using the memory map 306, then allocates the physical memory address for the application data 308.

In one embodiment, the operating system maintains an application list 315 of memory intensive applications. When an application requests an initial memory allocation for its data, the operating system determines whether the requesting application is present in the list 315. If the application is listed, the operating system allocates physical memory from the high performance memory 303; otherwise, the operating system 304 allocates physical memory from the low power memory 302. The operating system 304 also performs data migration based on the list. For example, if the system switches from a limited power supply (e.g., battery power) to a high availability power supply, the operating system 304 checks the application list to determine which pages of application data to migrate to the high performance memory 303 when transitioning out of the active hibernate state. Pages associated with applications designated as high demand applications on the list 315 are migrated to the high performance memory 303, while pages associated with lower demand applications remain in the low power memory 302.

Figure 4:
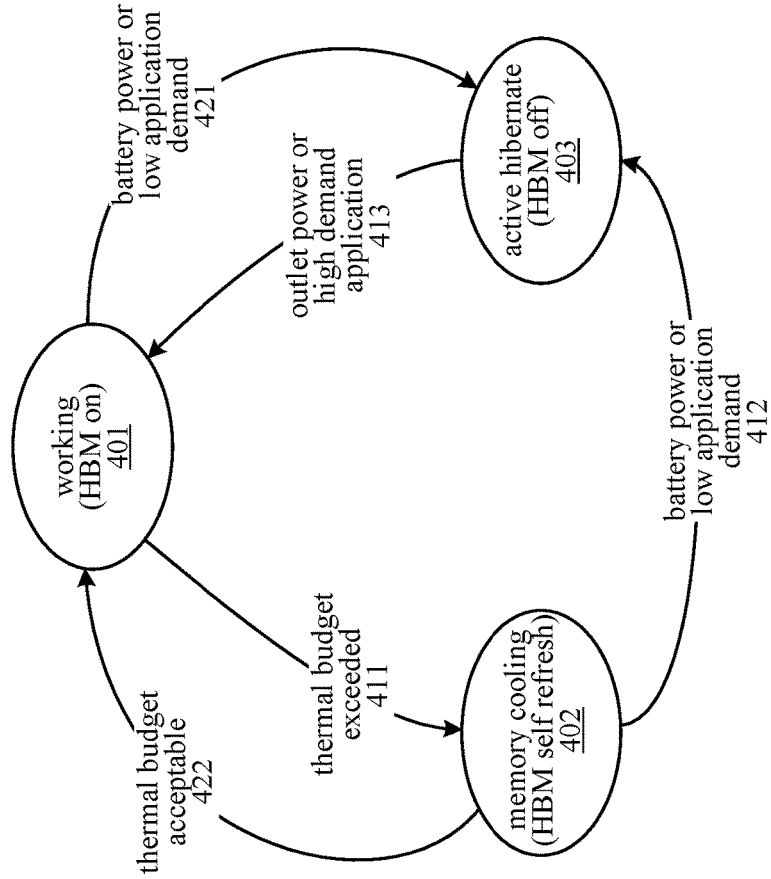
FIG. 4 illustrates a state diagram including working, memory cooling, and active hibernate states, according to an embodiment.

FIG. 4 illustrates a state diagram 400 showing transitions between the working, memory cooling, and active hibernate states, according to an embodiment. The state diagram 400 describes the operation of a state machine implemented by the operating system 304 and/or the power control hardware 310. In the normal working state 401, both of the high performance memory 303 and the low power memory 302 are working; that is, memory requests are being serviced for both of the memory types 302 and 303.

In the self-refresh or memory cooling state 402, the high performance memory 303 is operated in its self-refresh mode to reduce power consumption and dissipation in the high performance memory die. Memory accesses are not serviced from the high performance memory 303 in state 402, and the memory 303 is thus allowed to cool. When transitioning from the working state 401 to the self-refresh state 402, application data 308 is copied from the high performance memory 303 to the low power memory 302, and the page tables 307 are updated so that memory requests for the data 308 are serviced from the low power memory 302 instead of the high performance memory 303.

In one embodiment, the state 402 is entered from the working state 401 when a thermal budget is exceeded 411. For example, operating the system 100 in the working state 401 causes heat to accumulate in the high performance memory 303 die. When the die temperature exceeds a temperature threshold for longer than a predetermined time, the thermal budget is exceeded and the system 100 enters the memory cooling state 402. The memory cooling state 402 is also able to return to the normal working state 401. Continuing the previous example, when the temperature falls below the threshold temperature for a predetermined time, the thermal budget is acceptable and the system 100 transitions 422 from the memory cooling state 402 to the working state 401.

The system 100 thus transitions between the normal working state 401 and the memory cooling state 402 as an active memory cooling technique that can be used for applications where performance would otherwise by limited by thermal constraints. In one embodiment, active memory cooling is used in a mobile device that has Z height constraints, which restricts memory cooling by air flow or other thermal solutions. Since the memory access latencies for both types of memory 302 and 303 are relatively fast, the system 100 can transition between the states 401 and 402 as appropriate in response to measured thermal conditions without interrupting or stalling the application 305, particularly if the transitions are performed during application idle times. In addition, the penalty for restoring data 308 to the high performance memory 303 upon transitioning back to the working state 401 need not be incurred since the memory 303 maintains the original data 308 while operating in self-refresh mode.

In the active hibernate state 403, the high performance memory 303 is powered down and memory requests for the application data 308 are serviced from the low power memory 302. The high performance memory 303 does not self-refresh and therefore does not retain its contents. Accordingly, additional power is conserved, compared to operation in the self-refresh state 402.

From either the working state 401 or the self refresh state 402, the system 100 transitions (421 and 412, respectively) to the active hibernate state 403 when the demand for memory bandwidth is low, or the system 100 is powered by a limited capacity or low availability power supply, such as a battery. For example, the system 100 operates in the working state 401 when running a memory intensive application. When the application is terminated and no other application is running that requires the high performance memory 303, the system 100 transitions to the active hibernate state 403 by migrating any remaining application data from the high performance memory 303 to the low power memory 302, then powering down the high performance memory 303. Thus, the operating system 304 tracks which applications are associated with high memory throughput and powers off the high performance memory 303 in the active hibernate state 403 when no high demand applications are running.

In one embodiment, transitions to the active hibernate state 403 are performed in response to measured memory utilization in the system 100. The counters 313 in the power control hardware 310 include an idle counter that measures the duration of an idle period during which memory access activity (e.g., memory access frequency measured by bandwidth monitors 314) is below a threshold. Low memory demand is detected when the idle period exceeds a threshold duration. The operating system 304 transitions to the active hibernate state 403 from either of the states 401 and 402 in response to receiving an indication of the detected low memory demand.

In one embodiment, the active hibernate state 403 is invoked to conserve power when the system is operating from a limited power supply, such as a battery. The power control hardware 310 receives a power connection status 312 that indicates whether the system 100 is powered by a high availability power supply (e.g., an alternating current (AC) power outlet) or a limited capacity or low availability power supply (e.g., a direct current (DC) power source such as a battery). The operating system 304 responds to an indication that the system 100 is operating from a limited power supply by transitioning to the active hibernate state 403 from either of the states 401 and 402.

In one embodiment, the active hibernate state 403 is invoked when the system is operating from a limited power supply even if high demand applications are running or high memory usage is detected. In an alternative configuration, running a high memory demand application prevents transitioning to the active hibernate state 403 even when the system 100 is operating from a limited power supply.

The system 100 transitions 413 from the active hibernate state 403 to the working state 401 when the system 100 switches from a limited or low availability power supply (e.g., a battery having a known finite capacity) to a high availability power supply (e.g., a wall outlet having an indefinite capacity), or when it begins running an application that demands high memory throughput. The power control hardware 310 receives the power connection status 312 which indicates when the power input of system 100 has been connected to a high availability power supply. The power control hardware 310 notifies the operating system 304, which responds by transitioning to the working state 401.

An increase in memory throughput demand is determined by any of several different methods. In one embodiment, the operating system maintains a list 315 of high demand applications and, when one of the high demand applications is started, the operating system 304 transitions 413 to the working state 401 and powers on the high performance memory 303 so that it is available for the application to use.

Alternatively, the application itself can request the use of high performance memory 303 from the operating system 304 when requesting allocation of application data (e.g., via malloc( )). If the system is in the active hibernate state 403, the operating system 304 responds to the request by transitioning to the working state 401 to power on the high performance memory 303, then allocates physical memory from the high performance memory 303 to fill the request.

The operating system 304 can also initiate the transition 413 from the active hibernate state 403 to the working state 401 in response to increased memory activity measured by the bandwidth monitors 314. In this case, the bandwidth monitors 314 notify the operating system 304 that the memory access frequency, throughput, or other metric for measuring memory activity has exceeded a predetermined threshold. The bandwidth monitors 314 also indicate which data is being accessed by the increased memory activity. The operating system 304 responds by transitioning from the active hibernate state 403 to the working state 401 and migrating the high touch data to the high performance memory 303.

In one embodiment, the operating system 304 initiates a transition from the active hibernate state 403 to the working state 401 when the system 100 is switched from a limited power supply to a high availability power supply. In this case, the power control hardware 310 receives a power connection status signal 312 indicating that the system 100 is connected to the high availability power supply. The power control hardware 310 notifies the operating system 304, which responds by initiating the transition 413 to the working state 401. In one embodiment, if no memory intensive applications are running, then the operating system 304 remains in active hibernate 403 and does not transition to the working state 301 in response to a switch to the high availability power supply.

When transitioning from the active hibernate state 403 to the working state 401, the high performance memory 303 is powered on, and the operating system 304 migrates memory pages containing high touch application data 308 from the low power memory 302 to the high performance memory 303. The operating system 304 also updates the page table entries in page tables 307 to reflect the change in physical memory address for each page that is migrated. The time for restoring application data to the high performance memory 303 is on the order of hundreds of milliseconds. After the migration, memory requests for the high touch application data 308 are serviced from the high performance memory 303.

Figure 5A:
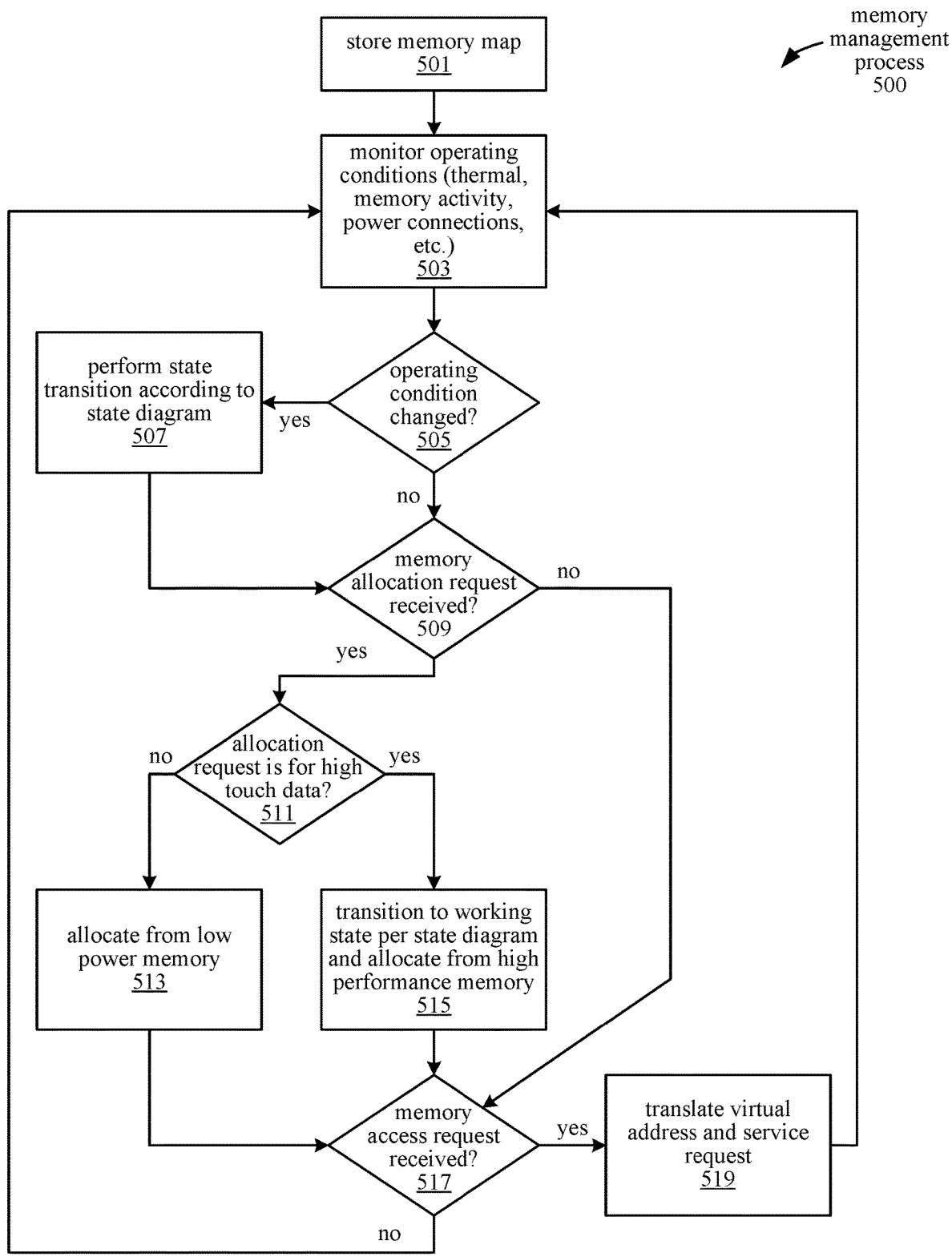
FIG. 5A illustrates a flow diagram for a memory management process, according to an embodiment.

FIG. 5A illustrates a process 500 for managing memory in a computing system 100 that supports memory cooling 402 and active hibernate 403 states, according to an embodiment. Memory management process 500 is performed by components of the computing system 100, such as the memory manager of the operating system 304, the power control hardware 310, memories 302 and 303, bandwidth monitors 314, etc.

At block 501, a memory map 306 is maintained that associates physical memory addresses with their types (i.e., whether the physical addresses refer to locations in the high performance memory 303 or low power memory 302) and their locations in the NUMA interconnect (e.g., their distances from the processing unit 301). As illustrated in FIG. 3, the memory map 306 is stored in a memory device accessible to the processing unit 301. In alternative embodiments, the memory map 306 can be stored in one of the other memory devices in the system 100, such as memory 302.

At block 503, components in the system 100 monitor operating conditions in the system 100, such as thermal metrics, memory activity, power connection status, etc. Thermal metrics (e.g., temperature, rate of temperature increase, time above a threshold temperature, etc.) are measured using a thermal sensor 314. In one embodiment, the sensor 314 measures the die temperature of the high performance memory 303 and is used to detect whether the high performance memory 303 has exceeded its thermal budget. Another operating condition that is monitored at block 503 is the power connection status 312, which indicates whether the system 100 is being supplied power from a high availability power supply such as a wall outlet, or a limited power supply such as a battery.

At block 503, bandwidth monitors 314 also measure memory activity, such as an access frequency for the application data 308 or the memory throughput for the data 308. The bandwidth monitors 314 are thus used to identify high touch data stored in the low power memory 302 for which memory activity for data exceeds a threshold, so that the data 308 can be migrated to high performance memory 303. The bandwidth monitors 314 are also used to identify data stored in the high performance memory 303 that is not being accessed frequently or does not require the high bandwidth capabilities of the memory 303.

At block 505, if no change in the operating conditions is detected, the process 500 continues at block 509. However, as provided at block 507, a change in one or more of the monitored operating conditions causes a state transition according to the state diagram in FIG. 4. For example, a change in the power connection status 312 indicating that the system 100 has switched to battery power causes the state to change from the working state 401 to the active hibernate state 403, or an indication from the thermal sensor 314 that the high performance memory 303 has exceeded its thermal budget causes the state to transition from the working state 401 to the memory cooling state 402.

At block 509, if a memory allocation request has not been received, the process 500 continues at block 517. If a memory allocation request has been received, the process 500 continues at block 511. The memory allocation request originates from the application 305, which requests the allocation of memory for storing its application data 308. At block 511, the operating system 304 receives the allocation request and determines whether the allocation will be for high touch data. In one embodiment, the operating system 304 determines that the data 308 to be allocated is high touch data if the application 305 originating the allocation request is identified in the list 315 as a memory intensive application, or if the allocation request explicitly indicates that the data is to be allocated in high performance memory 303.

If the allocation request is not for high touch data, the operating system 304 allocates physical memory for the data from the low power memory 302, as provided at block 513.

If the allocation request is for high touch data, the operating system 304 allocates physical memory for the data from the high performance memory 303, as provided at block 515. In the memory cooling state 402, the high performance memory 303 is in self refresh mode and in the active hibernate state 403, the memory 303 is powered down. Thus, if the system is in either of these states, the operating system transitions the state to the working state 401 prior to allocating space from the high performance memory 303. As part of the allocation process in 513 or 515, the operating system 304 updates the page tables 307 to associate the physical memory address allocated from the memory 302 or 303 with a virtual memory address used by the application 305 to access the data 308. Physical memory addresses for the appropriate type of memory is determined based on the memory map 306.

After the allocation of memory for data 308, the application 305 accesses the data 308 by sending memory access requests via the operating system 304 to read from or write to the physical memory locations allocated for the data 308. At block 517, if a memory access request has not been received from the application 305, the process 500 returns to block 503. If a memory access request for the data 308 has been received from the application 305, the process 500 continues at block 519. At block 519, the operating system 304 translates the virtual memory address specified in the memory access request into its previously allocated physical memory address using the TLB 309 and page tables 307, as appropriate, then services the request by accessing (i.e., reading or writing) the application data 308 at the physical memory address. From block 519, the process 500 returns to block 503. Blocks 503-519 repeat to continue handling allocation requests and memory access requests while monitoring operating conditions and effecting state transitions in response to changes in the operating conditions.

On occasion, data 308 that is initially stored in one type of memory is migrated to a different type of memory due to state transitions 507. For example, data 308 in the high performance memory 303 is migrated to the low power memory 302 when the state transitions from the working state 401 to the active hibernate state 403. A memory access request prior to the state transition is serviced by accessing a physical memory address of the high performance memory 303, while a second memory access request for the same data 308 (i.e., specifying the same virtual address) received after the state transition is serviced by accessing a physical memory address of the low power memory 302.

Figure 5B:
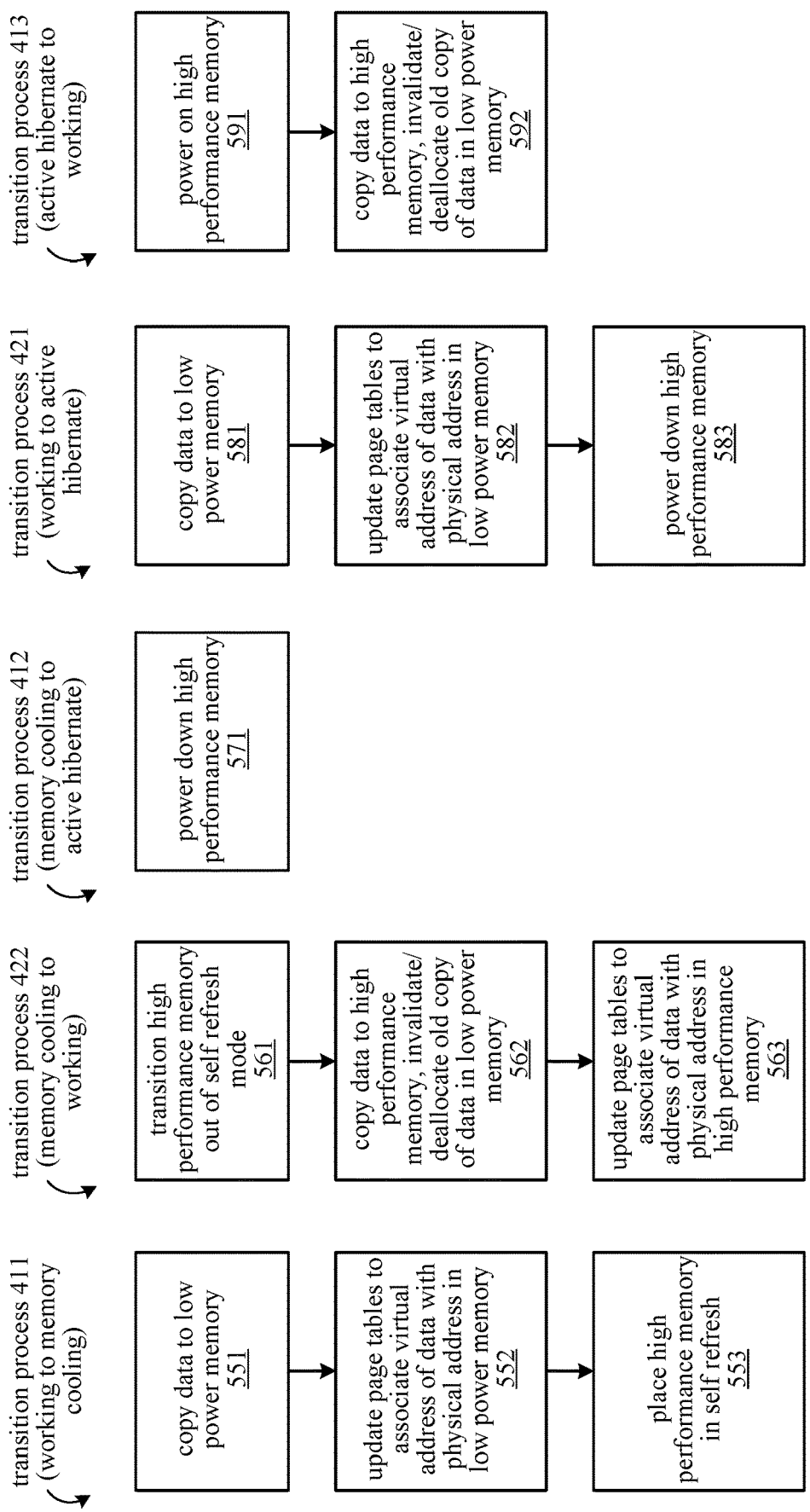
FIG. 5B illustrates flow diagrams for state transition processes, according to an embodiment.

FIG. 5B illustrates processes 411, 412, 413, 421, and 422 for transitioning between different states, according to an embodiment. The transition processes 411, 412, 413, 421, and 422 are performed as part of block 507 in process 500. Process 411 is performed when transitioning from the working state 401 to the memory cooling 402 state. In one embodiment, the transition process 411 is performed in response to a change in a thermal metric exceeding a thermal threshold, such as when a die temperature of the high performance memory 303 exceeds a temperature threshold.

At block 551, the operating system 304 copies application data 308 from the high performance memory 303 to the low power memory 302. The operating system 304 identifies a suitable physical address in the low power memory 302 to place the data 308 based on the memory map 306. At block 552, the operating system 304 updates the page tables 307 to associate the virtual memory address of the copied data with the new physical memory address in the destination memory 302. At block 553, the high performance memory 303 is placed in self-refresh mode. In self-refresh mode, the contents of the memory 303 are retained, but the memory 303 does not respond to memory access requests. Thus, after transitioning to the memory cooling state 402, memory requests are serviced using the data 308 stored in the low power memory 302. The data 308 in the high performance memory 303 is inaccessible while the memory 303 cools.

Process 422 is performed when transitioning from the memory cooling 402 state to the working state 401. In one embodiment, the transition process 422 is performed in response to detecting that the thermal metric no longer exceeds the thermal threshold, such as when a die temperature of the high performance memory 303 decreases below the temperature threshold.

At block 561, the high performance memory 303 is transitioned out of self-refresh mode. The operations of block 562 are performed if the data 308 is not already in the high performance memory, such as when high touch data 308 is allocated in the low power memory 302 when the high performance memory was in self-refresh mode. However, in some cases, the data 308 is already stored in the high performance memory 303, such as when data 308 is stored in the memory 303 in an earlier working state 401 prior to the memory cooling state 402. At block 562, high touch data 308 stored at a physical memory address in the low power memory 302 is migrated to the high performance memory 303. The data 308 is copied to a physical memory address in the high performance memory 303 and the copy of data 308 in the low power memory 302 is invalidated and/or deallocated. The physical memory address of the data 308 in the low power memory 302 is thus made available for storing other application data (e.g., data that is not high touch). Whether the data 308 was already present in the high performance memory 303 or was migrated at block 562, the page tables 307 are updated at block 563 so the virtual address used by the application 305 to access the data 308 is associated with the physical memory address in the high performance memory 303.

Process 412 is performed when transitioning from the memory cooling 402 state to the active hibernate state 403. The transition 412 from the memory cooling state 402 to the active hibernate state 403 is triggered when the system 100 disconnects from a high-availability power supply (e.g., switches to battery power), or when the memory demand from applications running in the system 100 is low (e.g., all memory intensive applications have ended).

In the memory cooling state 402, data 308 is already stored in low power memory 302 and high performance memory 303 is operating in self-refresh mode without servicing any memory access requests. Thus, transitioning 412 from the memory cooling state 402 to the active hibernate state 403 is accomplished by powering down the high performance memory 303, as provided at block 571.

Process 421 is performed when transitioning from the working state 401 to the active hibernate state 403. The transition 421 is triggered when the system 100 disconnects from the high-availability power supply, as indicated by the power connection status 312, or when the memory demand from applications running in the system 100 is low. At block 581, the data 308 is copied to the low power memory 302, then the page tables 307 are updated to associate the virtual address of the data 308 with the physical address of the low power memory 302 at which the data 308 is stored (block 582). At block 583, the high performance memory 303 is powered off.

Process 413 is performed when transitioning from the active hibernate state 403 to the working state 401. The transition 413 is triggered when the power connection status 312 indicates that the system 100 is connected to a high-availability power supply that is able to supply power for operating the high performance memory and a memory intensive application 305 is running. The application 305 is determined to be memory intensive based on a high level of memory activity from the application 305 as observed by the bandwidth monitors 314, the application's inclusion in the application list 315, and/or an indication from the application 305 itself.

The high performance memory 303 is powered on at block 591. At block 592, the application data 308 is moved from the physical memory address in the low power memory 302 to a physical memory address in the high performance memory 303. The data 308 is copied to a physical memory address in the high performance memory 303 and the copy of data 308 in the low power memory 302 is invalidated and/or deallocated. The physical memory address of the data 308 in the low power memory 302 is thus made available for storing other application data (e.g., data that is not high touch).

The system 100 includes a hysteresis timer 313 that tracks the time elapsed since the most recent state transition. When operating conditions are otherwise sufficient to cause a state transition to occur, the operating system 304 checks the hysteresis timer 313 and does not change the state if a hysteresis time-out period has not elapsed. The hysteresis timer 313 thus prevents the state from switching rapidly between two states due to corresponding rapid changes in the operating conditions.

In general, the system 100 is distinguishes between the high performance memory 303 and low power memory 302 using the memory map 306, and based on bandwidth monitors 314, application list 315, and indications from the application 305 is also able to distinguish between high touch data 308 that benefits from placement in the high performance memory 303 and low touch data that remains in low power memory 302. The use of this information to effect transitions between the working 401, memory cooling 402 and active hibernate 403 states enables the high memory throughput capabilities of the high performance memory 303 to be provided for the most memory intensive applications, while operating within thermal constraints and conserving power when appropriate.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method of operating a computing system, comprising:
    storing a memory map identifying a first physical memory address as associated with a high performance memory and identifying a second physical memory address as associated with a low power consumption memory;
    servicing a first memory access request received from an application by accessing application data at the first physical memory address;
    in response to a change in one or more operating conditions of the computing system, moving the application data between the first physical memory address and the second physical memory address based on the memory map, wherein moving the application data between the first physical memory address and the second physical memory address causes a state transition of the high performance memory between a working state and one of a memory cooling state or an active hibernate state; and
    servicing a second memory access request received from the application by accessing the application data at the second physical memory address.

2. The method of claim 1, wherein the first memory access request and the second memory access request both request access for a same virtual memory address; and the method further comprising:
    in a page table, associating the same virtual memory address with the first physical memory address; and
    in response to the change in the one or more operating conditions, updating the page table to associate the same virtual memory address with the second physical memory address, wherein updating the page table to associate the same virtual memory address with the second physical memory address causes the state transition of the high performance memory from the working state to the memory cooling state in which the high performance memory is placed in a self-refresh mode.

3. The method of claim 1, wherein:
    the one or more operating conditions includes a thermal metric;
    the application data is moved from the high performance memory to the low power consumption memory in response to the thermal metric exceeding a thermal threshold; and
    the method further comprises, in response to the change in the one or more operating conditions, causing the high performance memory to operate in a self-refresh mode, wherein causing the high performance memory to operate in the self-refresh mode causes the state transition of the high performance memory from the working state to the memory cooling state until:
    a hysteresis time-out period has elapsed; and
    the thermal metric is below the thermal threshold, wherein after the hysteresis time-out period has elapsed and the thermal metric is below the thermal threshold, the high performance memory transitions from the memory cooling state to the working state.

4. The method of claim 1, wherein:
    the application data is moved from the high performance memory to the low power consumption memory in response to an indication that the high performance memory is switched from a high availability power supply to an alternative power source; and
    the method further comprises powering off the high performance memory until:
    a hysteresis time-out period has elapsed; and
    a power connection status indicates that the high availability power supply is connected to the high performance memory, wherein powering off the high performance memory causes the state transition of the high performance memory from the working state to the active hibernate state, and, after the hysteresis time-out period has elapsed and the power connection status indicates that the high availability power supply is connected to the high performance memory, the high performance memory transitions from the active hibernate state to the working state.

5. The method of claim 1, further comprising:
    in response to receiving from the application an allocation request for the application data, determining whether the allocation request is for high touch data; and in response to determining that the allocation request is for the high touch data, allocating the first physical memory address for the application data based on the memory map.

6. The method of claim 1, further comprising:
measuring an access frequency for the application data, wherein:
the one or more operating conditions includes the access frequency exceeding a frequency threshold; and
the application data is moved from the second physical memory address to the first physical memory address in response to the access frequency exceeding the frequency threshold, wherein moving the application data from the second physical memory address to the first physical memory address causes the state transition of the high performance memory from the active hibernate state to the working state.

7. The method of claim 1, further comprising:
after moving the application data, powering off the high performance memory, wherein powering off the high performance memory causes the state transition of the high performance memory from the working state to the active hibernate state.

8. The method of claim 1, wherein moving the application data further comprises:
copying the application data from the first physical memory address to the second physical memory address; and
invalidating the application data at the first physical memory address.

9. A computing device, comprising:
a memory map configured to identify a first physical memory address as associated with a high performance memory and identify a second physical memory address as associated with a low power consumption memory; and
a processor configured to:
service a first memory access request received from an application by accessing application data at the first physical memory address;
in response to a change in one or more operating conditions of the computing device, move the application data between the first physical memory address and the second physical memory address based on the memory map, wherein moving the application data between the first physical memory address and the second physical memory address causes a state transition of the high performance memory between a working state and one of a memory cooling state or an active hibernate state; and
service a second memory access request received from the application by accessing the application data at the second physical memory address.

10. The computing device of claim 9, wherein:
the first memory access request and the second memory access request both request access for a same virtual memory address;
and
the computing device further comprises a page table configured to associate the same virtual memory address with the first physical memory address, wherein the processor is further configured to, in response to the change in the one or more operating conditions, update the page table to associate the same virtual memory address with the second physical memory address, wherein updating the page table to associate the same virtual memory address with the second physical memory address causes the state transition of the high performance memory from the working state to the memory cooling state in which the high performance memory is placed in a self-refresh mode.

11. The computing device of claim 9, further comprising:
a power input configured to selectively supply power to the high performance memory from a high availability power supply, wherein:
the application data is moved from the high performance memory to the low power consumption memory in response to an indication that the power input is switched from the high availability power supply to an alternative power source; and
the high performance memory is configured to operate in a self-refresh mode until:
a hysteresis time-out period has elapsed; and
the power input is connected to the high availability power supply, wherein powering off the high performance memory causes the state transition of the high performance memory from the working state to the active hibernate state, and, after the hysteresis time-out period has elapsed and the power input is connected to the high performance memory, the high performance memory transitions from the active hibernate state to the working state.

12. The computing device of claim 9, wherein the processor is further configured to:
in response to receiving from the application an allocation request for the application data, determine whether the allocation request is for high touch data; and
in response to determining that the allocation request is for the high touch data, allocate the first physical memory address for the application data based on the memory map.

13. The computing device of claim 9, further comprising:
a power control circuit coupled with the high performance memory and configured to power off the high performance memory after moving the application data, wherein powering off the high performance memory causes the state transition of the high performance memory from the working state to the active hibernate state.

14. The computing device of claim 9, wherein the processor is configured to move the application data by:
copying the application data from the first physical memory address to the second physical memory address; and
invalidating the application data at the first physical memory address.

15. A computing system, comprising:
a high performance memory;
a low power consumption memory;
a memory map configured to identify a first physical memory address as associated with the high performance memory and identify a second physical memory address as associated with the low power consumption memory; and
a processing unit coupled with the high performance memory and the low power consumption memory, wherein the processing unit is configured to:
service a first memory access request received from an application by accessing application data at the first physical memory address;
in response to a change in one or more operating conditions of the computing system, move the application data between the first physical memory address and the second physical memory address based on the memory map, wherein moving the application data between the first physical memory address and the second physical memory address causes a state transition of the high performance memory between a working state and one of a memory cooling state or an active hibernate state; and service a second memory access request received from the application by accessing the application data at the second physical memory address.

16. The computing system of claim 15, wherein:
the high performance memory has a higher data throughput than the low power consumption memory;
the low power consumption memory has a lower power consumption when operating in a self-refresh mode than the high performance memory operating in the self-refresh mode; and
each of the high performance memory and the low power consumption memory is a byte-addressable memory having a memory access latency that is less than 100 nanoseconds.

17. The computing system of claim 15, further comprising:
a set of memory bandwidth monitors coupled to the low power consumption memory via an interconnect fabric, and configured to measure an access frequency for the application data, wherein the one or more operating conditions includes the access frequency exceeding a frequency threshold; and
wherein the processing unit is configured to move the application data from the second physical memory address to the first physical memory address in response to the access frequency exceeding the frequency threshold, and wherein moving the application data from the second physical memory address to the first physical memory address causes the state transition of the high performance memory from the active hibernate state to the working state.

18. The computing system of claim 15, further comprising:
a set of thermal sensors configured to measure a thermal metric for the high performance memory, wherein:
the one or more operating conditions includes the thermal metric;
the application data is moved from the high performance memory to the low power consumption memory in response to the thermal metric exceeding a thermal threshold; and
the high performance memory is configured to operate in a self-refresh mode, wherein causing the high performance memory to operate in the self-refresh mode causes the state transition of the high performance memory from the working state to the memory cooling state until:
a hysteresis time-out period has elapsed; and
the thermal metric is below the thermal threshold, wherein after the hysteresis time-out period has elapsed and the thermal metric is below the thermal threshold, the high performance memory transitions from the memory cooling state to the working state.

19. The computing system of claim 15, further comprising:
a plurality of non-uniform memory access (NUMA) nodes coupled by an interconnect fabric, wherein:
the processing unit resides in one of the plurality of NUMA nodes;
the high performance memory and the low power consumption memory reside in one or more of the plurality of NUMA nodes; and
the processing unit is further configured to allocate memory for the application based on a distance of the memory from the processing unit.

* * * * *